United States Patent [19]

Benecke

[11] Patent Number: 5,338,997
[45] Date of Patent: Aug. 16, 1994

[54] MICROMANIPULATOR FOR MOVING OBJECTS

[75] Inventor: Wolfgang Benecke, Berlin, Fed. Rep. of Germany

[73] Assignee: Fraunhofer Gesellschaft zur Foerderung der angewandten Forschung e.V., Fed. Rep. of Germany

[21] Appl. No.: 35,505

[22] Filed: Mar. 22, 1993

Related U.S. Application Data

[63] Continuation of Ser. No. 601,749, Nov. 13, 1990, abandoned.

Foreign Application Priority Data

Apr. 29, 1988 [DE] Fed. Rep. of Germany ....... 3814616

[51] Int. Cl.$^5$ ............................................ H01L 41/08
[52] U.S. Cl. .................................... 310/307; 310/331; 310/332
[58] Field of Search ............... 310/306, 307, 309, 311, 310/330–332

[56] References Cited

U.S. PATENT DOCUMENTS

| | | |
|---|---|---|
| 1,258,368 | 3/1918 | Smith .................................... 310/307 |
| 2,520,899 | 8/1942 | Smulski ................................. 310/307 |
| 2,782,682 | 2/1957 | Browning et al. ..................... 310/307 |
| 3,146,367 | 8/1964 | McNaney ........................... 310/331 X |
| 3,928,778 | 12/1975 | Ivanov et al. ......................... 310/331 |
| 3,961,501 | 6/1976 | Martinetz .......................... 310/331 X |
| 4,523,120 | 6/1985 | Assard et al. ..................... 310/331 X |
| 4,769,570 | 9/1988 | Yokoyama et al. .................. 310/332 |
| 4,785,177 | 11/1988 | Besocke ........................... 310/330 X |
| 4,906,840 | 3/1990 | Zdeblick et al. ................... 310/332 X |
| 5,034,645 | 7/1991 | Woodruff et al. ................. 310/332 X |
| 5,049,775 | 9/1991 | Smits ................................ 310/330 X |
| 5,072,288 | 12/1991 | MacDonald et al. ................ 310/330 |

Primary Examiner—Mark O. Budd
Attorney, Agent, or Firm—Evenson, McKeown, Edwards & Lenahan

[57] ABSTRACT

A micromanipulator suited for use in vacuum and microscopic systems is provided for moving objects permitting variable step spans up to approximately 100 μm while having high precision of movement and a high degree of miniaturization. The micromanipulator is equipped with bimaterial tongues which can be positioned with the aid of heating and sensor elements. The object carrier is moved by suitable coordination of the tongue movements. The micromanipulator permits any desired movements in a plane and rotary and tilting movements of the object carrier.

9 Claims, 2 Drawing Sheets

MICROMANIPULATOR FOR MOVING OBJECTS

This is a File Wrapper continuation of application Ser. No. 07/601,749, filed Nov. 13, 1990, now abandoned.

BACKGROUND AND SUMMARY OF THE INVENTION

The present invention relates to a micromanipulator for moving objects, in particular for moving small objects over microscopic distances. The precision of the fine mechanical adjusting elements equipped with micrometer screws that are frequently utilized for these motions is often insufficient for motions in modern microtechnology. These adjusting elements are also not suited for application in high-vacuum or other closed systems, in which mechanical execution is a source of disturbance. Better suited for applications of this type are electromagnetically operated adjusting elements or adjustment elements based on the piezo-electric effect.

A micromanipulator with which piezo-electric motion elements are used for moving objects is described in DE-OS 36 10 540. Due to the attainable deformation of the motion elements with the piezo-electric effect, there are at least two limitations to these micromanipulators. First, the individual steps of the motion are limited to the nm range so that a great many steps have to be performed over large distances for the motion. Second, the individual moving elements must not be dimensioned too small as the maximum achievable span of the step is diminished with a decreasing size of the moving elements, thereby limiting miniaturization of the manipulator.

An object of the present invention is to provide a micromanipulator for moving objects permitting variable step spans in a range up to approximately 100 $\mu$m while maintaining high precision of the motion and a high degree of miniaturization.

The aforesaid object has been achieved in accordance with the present invention by providing the mechanical elements of the micromanipulators as movable tongues composed of superimposed layers of different materials having varying thermal expansion coefficients.

The tongues are heated by energy input. As a tongue is composed of at least two layers having varying thermal expansion coefficients, the heat causes the tongue to bend. Objects can be moved by suited coordination of the motions of several tongues of a micromanipulator.

In order to obtain a linear motion of an object, the tongues can be arranged in pairs in such a manner that two tongues are lying opposite each other turned at 180°.

The basic body of the micromanipulator can be made of silicon; a material widely used in industrial microelectronics is thus utilized as the basic material. In order to obtain as great as possible motion steps at low heat levels, the tongue is made of a combination of materials having thermal expansion coefficients varying as much as possible. The combination of a layer of silicon compound (e.g., silicon nitrate or silicon dioxide) and a metal layer accommodate microstructure fabrication processes.

The temperature is raised by heating elements. In principle, however, it could also be achieved with other methods, e.g., thermal radiation. It is advantageous to construct the heating elements as electric resistances and to dispose them between or onto the layers in order to ensure even heating.

In order to exclude the influence of the ambient temperature on the position of the tongues, an especially favorable arrangement can be obtained, in which sensor elements are disposed on the tongues in order to detect the momentary position and in order to regulate the position. They can be based on various physical effects. The use of piezoresistances is especially advantageous as the static piezoresistive effect is particularly pronounced with silicon and the position of the tongues can be determined directly by measuring the pull and pressure load. Another advantage is that piezoresistances can be easily fabricated with the aid of conventional microelectronic techniques. The heating and sensor signals are linked to each other in mutual control circuits, whereby the tongues can be brought to the predeterminable positions, by way of illustration, by regulating the heat input. In this way, the motions of the tongues can be coordinated and the span of the steps can be determined. The design and operation of the individual gripping elements correspond to the steerable, position changing elements described in the unpublished German application DE 38 09 587.1.

In order to obtain a high degree of miniaturization, the control circuits and the micromanipulator are integrated on the same semiconductor chip. In this way, micromanipulators can be fabricated, which are composed of a great number of identical tongues, thereby making complicated motions possible even over a distance of many step spans.

If the tongue pairs are arranged along a line, the objects can be moved in a one-dimensional direction. By arranging the pairs of tongues along several parallel lines, the weight to be transported can be increased.

The tongue parts can also be arranged along two groups of intersecting parallel lines. This embodiment of the present invention permits any desired motion in a plane. A rotary motion can be obtained by an arrangement of the tongues along concentric circular lines, with the axis of rotation being perpendicular to the plane in which the tongue pairs are arranged.

Furthermore, a tilting motion about small angles is also possible in that the loose ends of the tongues supporting the object carrier at various points can be moved different distances away from the basic body. By steering out all the tongues simultaneously, the object can also be moved to a limited extent in a perpendicular direction to the plane in which the tongues are arranged. This motion, which is restricted by the length of the tongues, is extremely advantageous if the object, by way of illustration, is to be aligned in the focus of a beam of light or of electrons. All the described embodiments of the present invention are fabricated with processes known in micromechanics and in micro-electronics and are compatible to standard IC processes. The individual components are structured with the aid of planar lithography processes. The voltage level customary in micro-electronics suffices for operating a micromanipulator.

The micromanipulator of the present invention in its several embodiments is distinguished by having a high degree of miniaturization, high precision, great reliability and low costs. It is especially suited for moving objects in closed systems in which mechanical operation must be avoided, by way of illustration, in ultra-high vacuum apparatuses (e.g., raster electron microscopy). The extreme degree of miniaturization permits utilization in microhandling systems and in any kind of moving of objects in microscopic examinations, in processing or analyzing objects in microtechnology or in microbiology.

BRIEF DESCRIPTION OF THE DRAWINGS

These and other features, objects and advantages of the present invention will become more apparent from the following detailed description of several presently preferred embodiments when taken in conjunction with the accompanying drawings wherein.

DETAILED DESCRIPTION OF THE DRAWINGS

Figure 1A:
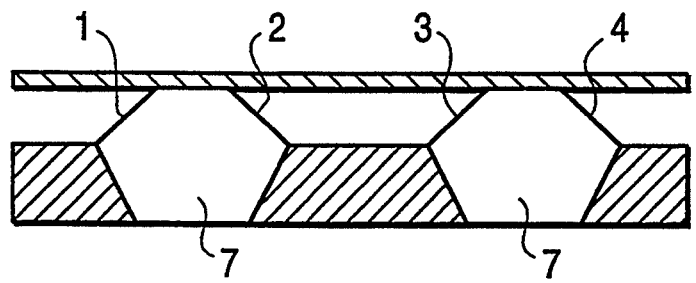
FIGS. 1A to E show the principle of operation of the micromanipulator.

The micromanipulator in FIG. 1A has a basic body 5 of monocrystalline silicone (thickness approximately 0.5 mm), it being advantageous to employ a silicon wafer usually used in microelectronics. In its simplest embodiment, the manipulator is provided with four tongues 1, 2, 3, 4 having a length of several hundred micrometers, which are composed of an epitactically precipitated high-boron-doped silicon layer (thickness several $\mu$m) and a vacuum deposited metal layer (preferably gold, thickness several $\mu$m). The tongues are defined by lithographic processes and laid bare from the basic body with the aid of anisotropic etching steps with etching pits 7 being formed. The layer of gold is applied in such a manner that it causes pull tension so that the tongues protrude from the etching pits when at rest (without energy input).

Figure 1B:
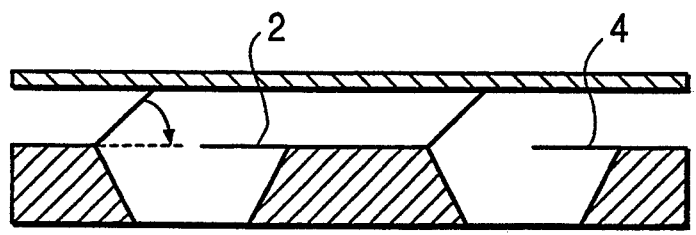
Figure 1C:
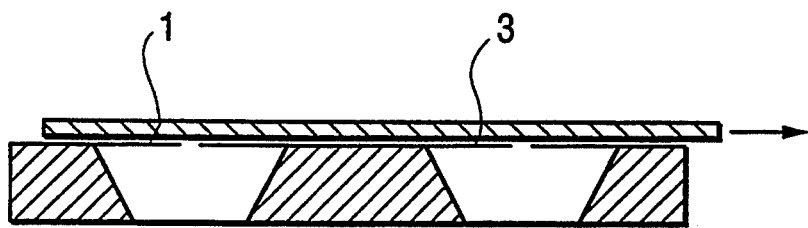
Figure 1D:
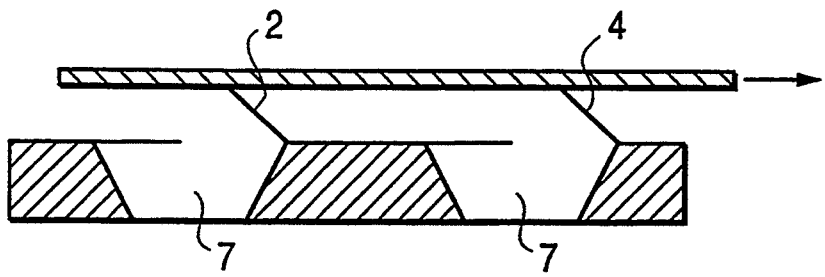
Figure 1E:
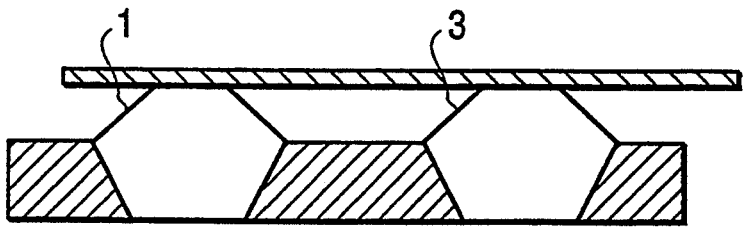

The object or the object carrier 6 lies upon the free ends of tongues 1, 2, 3, 4. In order to move the object carrier 6, tongues 2 and 4 are steered in such a manner that they lie in the plane of the surface of the basic body 5 (FIG. 1B). By steering tongues 1 and 3 in the direction of the etching pits 7, the objects moves in the direction shown by the bold arrow in FIG. 1C. By moving steering tongues 2 and 4 out of the etching pits 7, the object continues to be moved in the same direction (FIG. 1D). Finally if the pair of tongues 1, 3 is returned to its initial position, the original state is obtained with the difference that the object carrier has shifted compared to its initial position (FIG. 1E).

By reversing the tongue drive sequence, the direction of the motion of the object is reversed. The degree of initial steering of the tongue determines the path covered in a step. In this way, the step span can be regulated to a large extent (up to about 100 $\mu$m).

With the aid of the micromanipulator, the angle between the object carrier and the substrate surface can be changed. In order to tilt the object carrier, tongue 1 remains steered outward, whereas tongues 2, 3 and 4 are lowered into the surface of the basic body.

To a limited extent, the object carrier 6 can be moved in a perpendicular direction to its surface. In order to do so, all the tongues 1, 2, 3 and 4 are steered outward in parallel to the same degree. With this motion, a fine alignment of the objects can be performed.

Figure 2A:
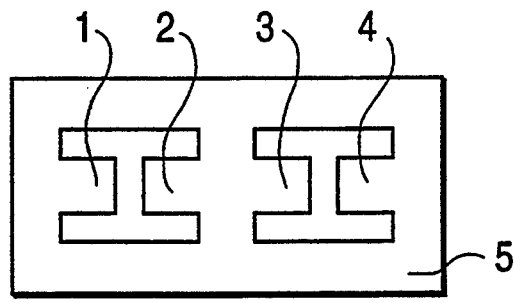
FIG. 2A shows a schematized representation of the micromanipulator for one-dimensional translations.

The micromanipulator of FIG. 1A is schematically represented in a top view in FIG. 2A. With the above-described steering, the linear arrangement of the tongue pairs 1, 2, 3 and 4 results in the objects being moved in a linear direction. By arranging several pairs of tongues in a series, the object can be transported over greater distances.

Figure 2B:
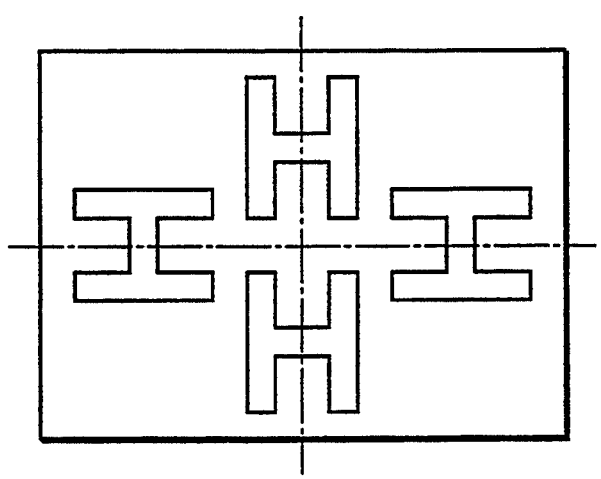
FIG. 2B shows a schematic representation of the micromanipulator for any motion in a plane.

In FIG. 2B, the tongue pairs are arranged along two intersecting lines. In this manner, the object can be moved in two directions of a plane. In a further embodiment of the present invention (not illustrated), many pairs of tongues are arranged along two groups of intersecting straight lines.

The object is transported to any desired point in the plane by suitable succession of linear motions along the different directions of the groups of straight lines.

Figure 2C:
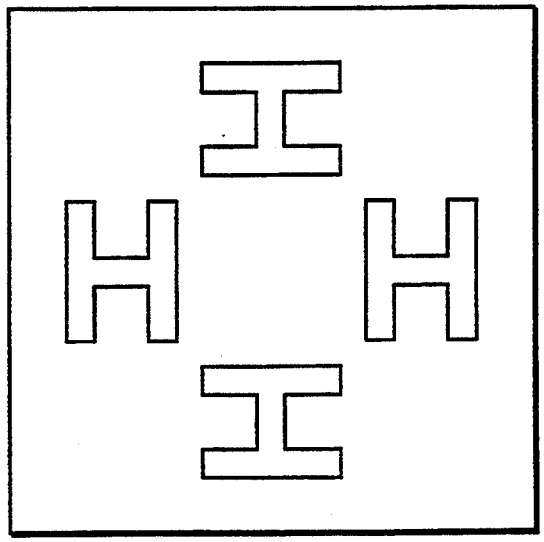
FIG. 2C shows a schematic representation of the micromanipulator for rotary motions.

The arrangement of the pairs of tongues along a circular line according to FIG. 2C results, with suitable coordination, in the motion of all the pairs in a rotary motion. In order to obtain as even as possible rotary motion, several pairs of tongues are arranged along a circular line or along concentric circular lines.

If moving objects whose dimensions are many times larger than the size of a tongue pair, the load can be distributed over many tongues. Proportionately many tongues are steered simultaneously for carrying out a motion.

Although the invention has been described and illustrated in detail, it is to be clearly understood that the same is by way of illustration and example, and is not to be taken by way of limitation. The spirit and scope of the present invention are to be limited only by the terms of the appended claims.

I claim:

1. A micromanipulator for moving an object, comprising movable tongues of superimposed layers of different materials having varying thermal expansion disposed on one side of a body, one of the materials being a silicon compound, where loose ends of the tongues are arranged so as to allow the object to lay on the tongues either directly or through an object carrier, and wherein heating elements are disposed on said tongues.

2. A micromanipulator for moving objects according to claim 1, wherein said heating elements are electric resistances and are arranged between the layers of said tongues.

3. A micromanipulator for moving objects according to claim 1, wherein sensor elements are disposed on said tongues for detecting and regulating the position, said sensor elements being operative based upon one of piezoresistive magnetic, piezo-electric, ferro-electric and capacitive effects, and said heating elements and said sensor elements are operatively connected via an electric control circuit.

4. A micromanipulator for moving objects according to claim 1, wherein all mechanical and electric components of the micromanipulator are integrated on a semiconductor chip.

5. A micromanipulator for moving objects according to claim 1, wherein several pairs of said tongues are arranged along one of a circular line and concentric circular lines.

6. A micromanipulator for moving objects according to claim 1, wherein every two of said tongues are arranged in pairs turned 180° to each other.

7. A micromanipulator for moving objects according to claim 1 wherein said body is composed of silicon compound.

8. A micromanipulator for moving objects according to claim 1, wherein said heating elements are electric resistances and are arranged upon the layers of said tongues.

9. A micromanipulator for moving objects according to claim 3, wherein said heating elements are electric resistances and are arranged between the layers of said tongues.

* * * * *